(12) United States Patent
Liu et al.

(10) Patent No.: US 8,390,984 B2
(45) Date of Patent: Mar. 5, 2013

(54) CAPACITOR SUBSTRATE STRUCTURE

(75) Inventors: Shur-Fen Liu, Hsinchu County (TW); Meng-Huei Chen, Kaohsiung County (TW); Bih-Yih Chen, Hsinchu County (TW); Yun-Tien Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 237 days.

(21) Appl. No.: 12/545,786

(22) Filed: Aug. 21, 2009

(65) Prior Publication Data

US 2010/0309607 A1 Dec. 9, 2010

(30) Foreign Application Priority Data

Jun. 4, 2009 (TW) ................ 98118498 A
Jul. 24, 2009 (TW) ................ 98124978 A

(51) Int. Cl.
*H01G 4/06* (2006.01)
*H01G 4/20* (2006.01)
*H01G 4/22* (2006.01)

(52) U.S. Cl. ........ 361/313; 361/311; 361/312; 361/319; 361/320; 361/321.1

(58) Field of Classification Search .................. None
See application file for complete search history.

(56) References Cited

U.S. PATENT DOCUMENTS

| | | | |
|---|---|---|---|
| 5,688,724 A | 11/1997 | Yoon et al. | |
| 6,270,835 B1 | 8/2001 | Hunt et al. | |
| 6,619,763 B2 * | 9/2003 | Trinh et al. | 361/302 |
| 6,657,849 B1 | 12/2003 | Andresakis et al. | |
| 6,905,757 B2 | 6/2005 | Matsushima et al. | |
| 6,924,971 B2 * | 8/2005 | Satsu et al. | 361/311 |
| 6,953,721 B2 | 10/2005 | Agarwal | |
| 7,158,364 B2 * | 1/2007 | Miyauchi et al. | 361/303 |
| 7,217,617 B2 | 5/2007 | Basceri | |
| 7,323,422 B2 | 1/2008 | Raaijmakers et al. | |
| 7,413,815 B2 | 8/2008 | Pramanik | |
| 7,776,762 B2 * | 8/2010 | Ahn et al. | 438/778 |
| 7,804,678 B2 * | 9/2010 | Wu et al. | 361/311 |
| 2007/0087563 A1 | 4/2007 | Ahn et al. | |
| 2007/0108490 A1 * | 5/2007 | Tan et al. | 257/296 |
| 2008/0186653 A1 * | 8/2008 | Lee et al. | 361/311 |
| 2008/0188615 A1 * | 8/2008 | Jenninger et al. | 524/590 |
| 2010/0214719 A1 * | 8/2010 | Kim et al. | 361/313 |
| 2010/0271750 A1 * | 10/2010 | Chiu et al. | 361/301.4 |

FOREIGN PATENT DOCUMENTS

| | | |
|---|---|---|
| CN | 1908063 | 2/2007 |
| CN | 1967751 | 5/2007 |
| CN | 101325128 | 12/2008 |
| CN | 101471181 | 7/2009 |
| TW | I594811 | 6/2004 |

OTHER PUBLICATIONS

Taiwan Patent Office, Office Action, Patent Application Serial No. 098124978, Nov. 12, 2012, Taiwan.

* cited by examiner

*Primary Examiner* — Jayprakash N Gandhi
*Assistant Examiner* — Dion Ferguson

(57) ABSTRACT

The disclosed is a capacitor substrate structure to reduce the high leakage current and low insulation resistance issue of organic/inorganic hybrid materials with ultra-high dielectric constant. The insulation layer, disposed between two conductive layers, includes multi-layered dielectric layers. At least one of the dielectric layers has high dielectric constant, including high dielectric constant ceramic powder and conductive powder evenly dispersed in organic resin. The other dielectric layers can be organic resin, or further include high dielectric constant ceramic powder dispersed in the organic resin. The substrate has an insulation resistance of about 50KΩ and leakage current of below 100 μAmp under operational voltage.

15 Claims, 4 Drawing Sheets

CAPACITOR SUBSTRATE STRUCTURE

CROSS REFERENCE TO RELATED APPLICATIONS

This application claims priority of Taiwan Patent Application No. 98118498, filed on Jun. 4, 2009, and Taiwan Patent Application No. 98124978, filed on Jul. 24, 2009, the entirety of which is incorporated by reference herein.

BACKGROUND OF THE INVENTION

1. Field of the Invention

The present invention relates to a capacitor substrate structure, and in particular relates to the insulation layer thereof.

2. Description of the Related Art

With technological advancement, requirements for more versatile electronic products have increased. As such, demand for flexible electronic products has also increased and thereby, demand for embedded passive/active devices in substrate. Embedded passive/active devices are designed with the consideration of requiring minimal circuit board area, high device density, and high product yield and reliability. A capacitor is a common example of one type of passive/active devices.

However, due to the sputtering or high temperature sintering methods applied to fabricate pure inorganic capacitor substrate materials, costs are relatively high due to requirement for specialized machinery and a high temperature process (greater than 800° C.). As such, pure inorganic capacitor substrate materials can not be directly embedded in PCB with low temperature process. Accordingly, low cost printed circuit board (PCB) processes are used to fabricate organic capacitor substrate materials. However, the dielectric constant (DK) of resin/ceramic powder composites of organic capacitor substrate materials cannot reach over 40. Thus, capacitor density for organic capacitor substrate materials is low and applicability thereof, is limited. Using conductive powders to increase the composite DK to over 45 have been disclosed. However, organic capacitor substrate materials having conductive powders are characterized by current leakage, thus limiting application thereof.

Almost half of the capacitor devices applied in electronic products today are decoupling capacitors with capacitance of 1 nF to 1 µF. Capacitor devices buried into substrates can efficiently shrink product volume of electronic products. However, drilling or sealing processes during the fabrication process are complex. Even though a high temperature sintered inorganic capacitor material meets high capacitance density requirements, it cannot be directly formed in substrate as capacitors due to high process temperature (900° C.). Accordingly, the invention discloses a structural design and corresponding materials for fabricating a decoupling capacitor substrate.

In recent year, the embedded capacitor technology is widely discussed, and some low capacitance capacitor devices are utilized in practice. The application thereof is focused in RF modules, however, it should be applied in more fields in future. In fact, the huge patent applications of the embedded capacitor reflect that is a compensative area for related companies.

Following are examples of patents related to powder type or resin formula-based capacitors, all of the patents do not disclose a structure for fabricating capacitors which reduce current leakage or have high-k and high capacitor density.

U.S. Pat. No. 6,657,849 B1 discloses a method for fabricating an embedded capacitor layer in PCB, wherein a thin dielectric layer serves as embedded capacitor. The capacitor structure is a conductive metal clad/dielectric layer, or conductive metal clad/dielectric layer/re-enforcing material layer. Two substrates with the same material and structure are laminated to form an embedded capacitor material. A re-enforcing material layer is used to reduce dimensional deformation from thermal or chemical reactions during the fabrication process. The laminating process is used to avoid gaps between the substrate. The material of the capacitor substrate comprises general ceramic powders, thermosetting polymers, thermoplastic polymers, and the likes. U.S. Pat. No. 7,413,815 B2 utilizes pre-polymers of some polymers such as PET, PEN, PVC, PPS, PI, PA, PA-PI, and the likes for an inter dielectric layer (enforcing layer). Therefore, the substrate structure is re-enforced with an inter dielectric layer of about 1.5 µm to 10 µm.

U.S. Pat. No. 6,905,757 B2 discloses a fabricating method for forming an embedded capacitor layer in a PCB, and in particular relates to a double-sided and thin copper clad laminate plate of high mechanical strength. It emphasized the composition and ratio of resin and powders, wherein the resin must be solvent soluble polyamide resin polymer is used as resin. A dielectric layer, such as a single-sided layer of less than 5 µm, is laminated with a conductive metal clad layer. The coating and baking processes are repeated to form a multi-layered structure with appropriate thickness, and the dielectric layer is then laminated with conductive metal clad layer.

Taiwan Pat. No. 1594811 disclose a lamination board for a capacitor layer and method for fabricating the same, wherein the multi-layered structure is a copper electrode/aluminum oxide barrier layer/modified by an aluminum oxide layer/binding metal layer composed of an Al, Ni, and Cr/copper electrode. However, the lamination board cannot be fabricated by a PCB process.

From 1997 to 2008, many patents such as U.S. Pat. No. 5,688,724 (1997), 6,270,835 B1 (2001), 6,953,721 B2 (2005), 7,217,617 B2 (2007), and 7,323,422 B2 (2008) have disclosed that a multi-layered dielectric layer can be applied in a capacitor or insulation layer of an IC. Almost all of the patents use inorganic material to fabricate the multi-layered structures by a CVD process of IC. Thus, current leakage current from insufficient thickness is minimized.

Accordingly, a novel capacitor structure and related composition is called for having high dielectric constant and minimal current leakage.

BRIEF SUMMARY OF THE INVENTION

The invention provides a capacitor substrate structure, comprising an insulation layer disposed between two conductive layers, wherein the insulation layer comprises: a first dielectric layer and a second dielectric layer. The second dielectric layer has a greater dielectric constant than the first dielectric layer and the second dielectric layer comprises high dielectric constant ceramic powders and conductive powders evenly dispersed in an organic resin.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
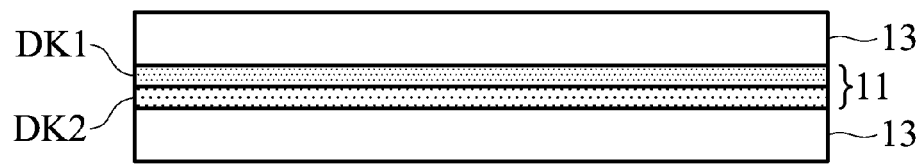
FIG. 1 is cross section of a capacitor substrate structure in one embodiment of the invention.

As shown in FIG. 1, the invention provides a capacitor substrate structure including an insulation layer 11 disposed between two conductive layers 13. The insulation layer 11 has a thickness of 3 µm to 60 µm. If the insulation layer 11 is too thick, it would be difficult to enhance capacitor density thereof. If the insulation layer 11 is too thin, the adherence between the insulation layer 11 and the conductive layers 13 would be lowered, and the breakage voltage would be reduced. Thus, the insulation layer 11 comprises a first dielectric layer (hereinafter DK1) and a second dielectric layer (hereinafter DK2), wherein the DK2 has a greater dielectric constant than the DK1. The DK2 is high-k dielectric layer, at least greater than 45. In one embodiment, the DK1 includes an organic resin. In another embodiment, the DK1 comprises high dielectric constant ceramic powders evenly dispersed in the organic resin. The DK2 is an organic/inorganic composite comprises high dielectric constant ceramic powders and conductive powders evenly dispersed in an organic resin.

The described organic resin can be thermoplastic resin, thermosetting resin, or combinations thereof. The suitable thermosetting resins for the invention can be epoxy resin, acrylic resin, polyimide resin, and/or phenolic resin. The epoxy resin includes bisphenol A diglycidyl ether, tetrabromobisphenol-A ether, cycloaliphatic epoxy resin such as dicyclopentadiene epoxy resin, naphthalene-containing epoxy resin, diphenylene epoxy resin, novolac epoxy resin, or o-cresol novolac epoxy resin. The thermosetting resin includes combinations of epoxy resin/polyphenyl ether, epoxy resin/polyphenyl ether/polybutadiene, or epoxy resin/acrylic resin.

The high dielectric constant ceramic powders occupies 5 wt % to 95 wt % of the DK1 or the DK2. If the ratio is higher than 95 wt %, the adhesion between the conductive layer and the insulation layer/DK1 would be degraded. If the ratio is lower than 5 wt %, it would be difficult to balance the dielectric constant and the breakage voltage. The high dielectric constant ceramic powders can be $BaTiO_3$, $Ba(Sr)TiO_3$, $SrTiO_3$, NPO, and the likes. In one embodiment, the ceramic powders are further doped by one or multiple metal ions such as calcium ion, magnesium ion, zirconium ion, bismuth ion, or the likes.

The conductive powders occupies 0.01 wt % to 20 wt % of the DK2. If the ratio is higher than 20 wt %, the DK2 will be conductive other than dielectric. If the ratio is lower than 0.01 wt %, the dielectric constant would not be enhanced by adding the conductive powders. The conductive powders can be carbon black, carbonanotube, metal, metal oxide, or combinations thereof. The carbon black includes high structure carbon black, low structure carbon black, carboxyl or hydroxyl surface modified carbon black, or combinations thereof. The metal includes nickel, aluminum, silver, copper, alloys thereof, or combinations thereof. The metal oxide includes $Al_2O_3$, ZnO, $Zn(Al)O$, $SnO_2$, $In_2O_3$, or combinations thereof.

In the invention, the organic resin is dissolved in appropriate solvent such as DMF, toluene, or other general solvents. As described above, the organic resin can be epoxy resin and/or acrylic resin. Subsequently, a curing agent, a catalyst, and other additives are added to the solution, evenly dispersed, and coated on a conductive layer such as copper clad laminate layer. The solvent of the varnish is then removed to form a dielectric layer on the conductive layer. The conductive layers, being coated by different dielectric layers, are laminated to complete the capacitor substrate structure of the invention. In addition, the dried dielectric layer (e.g. DK1) can be coated with another dielectric layer of different composition (e.g. DK2), and then laminated to other conductive layers to complete the capacitor substrate structure of the invention. The capacitor substrate structure has an insulation resistance higher than 50 kΩ and a leakage current less than 100 µAmp.

The curing agent includes diamine, dianhydride, phenol resin. The catalyst includes boron trifluoride complex, tertiary amine, metal hydroxide, monocyclic oxide, or imidazole compound such as 1-methylimidzaole, 1,2-dimethylimidazole, 2-heptadecylimidazole, 2-ethyl-4-methylimiazol, and the likes.

Figure 2:
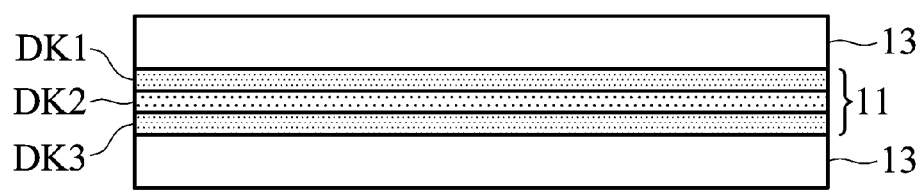
FIG. 2 is cross section of a capacitor substrate structure in another embodiment of the invention.

Although the insulation layer in FIG. 1 is a bi-layered structure, it can be tri-layered or multi-layered structure as shown in FIG. 2. In FIG. 2, the insulation layer 11 is formed of the DK1, the DK2, and a third dielectric layer (hereinafter DK3), wherein the DK2 has a higher dielectric constant than the DK1 and the DK3. In one embodiment, the DK3 has similar composition as the DK1, and can be organic resin or further contain high dielectric constant ceramic powders.

Figure 3:
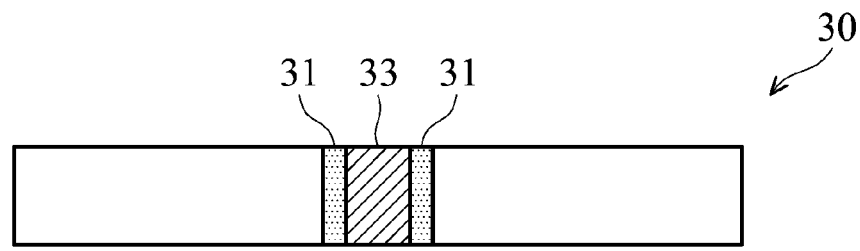
FIG. 3 is cross section of a via structure of a capacitor substrate in one embodiment of the invention.
Figure 4:
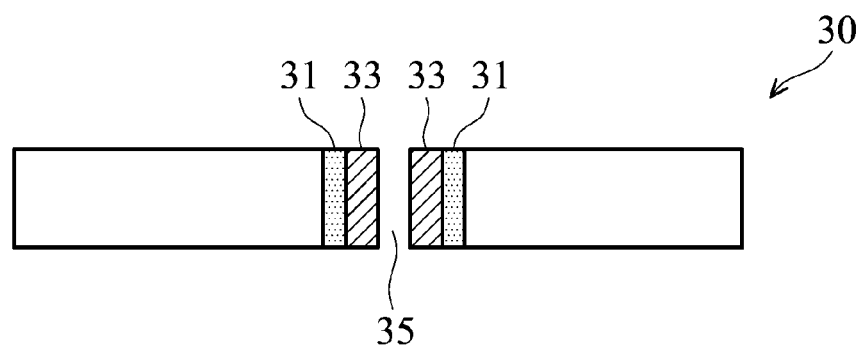
FIG. 4 is cross section of a via structure of a capacitor substrate in another embodiment of the invention.
Figure 5:
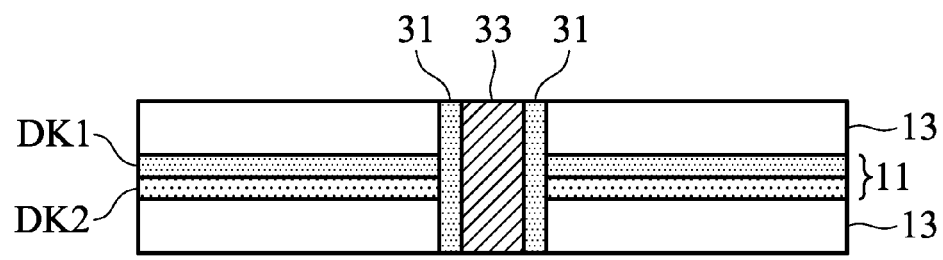
FIG. 5 illustrates the stacked capacitor of FIG. 1 connected by the via of FIG. 3.
Figure 6:
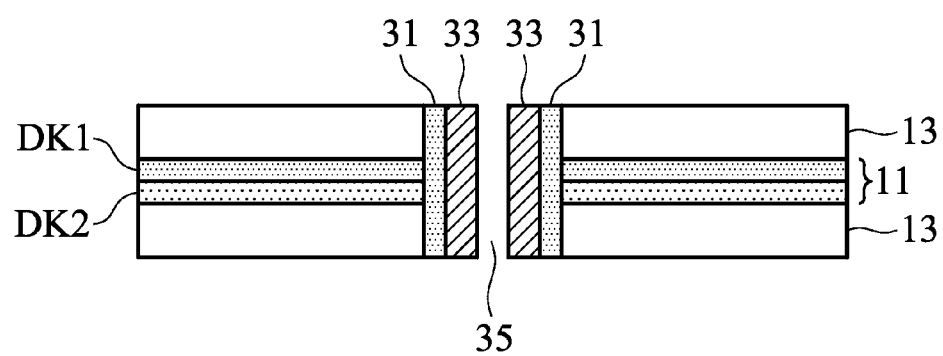
FIG. 6 illustrates the stacked capacitor of FIG. 1 connected by the via of FIG. 4.
Figure 7:
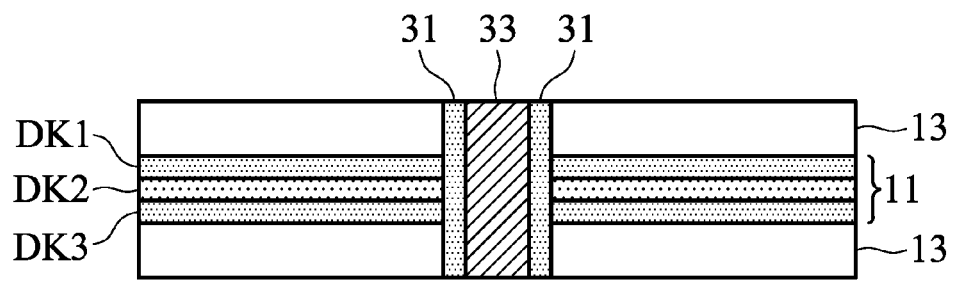
FIG. 7 illustrates the stacked capacitor of FIG. 2 connected by the via of FIG. 3.
Figure 8:
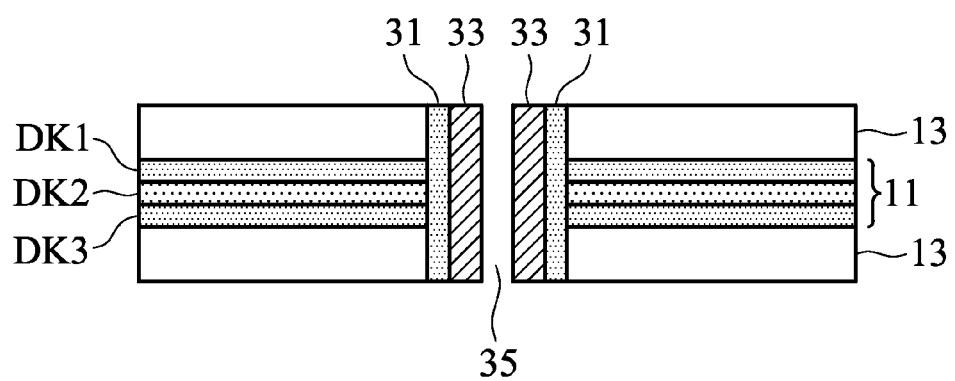
FIG. 8 illustrates the stacked capacitor of FIG. 2 connected by the via of FIG. 4.

The capacitor substrate of the invention may further include a via structure as shown in FIGS. 3 and 4. In FIG. 3, the via structure in the capacitor substrate 30 includes an inner ring of conductive material and an outer ring of dielectric layer 31. The dielectric layer 31 can be organic resin, or further contain high dielectric constant ceramic powders evenly dispersed in the organic resin. In FIG. 4, the via further includes an air gap 35 in the inner ring 33. In the invention, the capacitor substrates of FIG. 1 and/or FIG. 2 can be stacked to form multi-layered capacitor substrate, or optionally served as one or more layers in a general multi-layered printed circuit board, wherein the stacked capacitor substrates are partially or fully connected together or connected to other circuits of multilayered substrate by the described via structure if necessary, as shown in FIGS. 5-8. The via structures of the invention are optional, and standard via hole can be adopted to connect the circuit of the multi-layered substrate.

EXAMPLES

Example 1

The preparation of the capacitor substrate of the invention is described below.

Different weight ratios of bisphenol-A diglycidyl ether (188EL, commercially available from Chang Chun Plastics co., ltd, Taiwan), tetrabromo bisphenol-A diglcidyl ether (BEB-350, commercially available from Chang Chun Plastics co., ltd, Taiwan), cyclo aliphatic epoxy (HP-7200 commercially available from DIC, Japan), and multifunctional epoxy were weighted as shown in Table 1, added 10 mL of DMF, and then heated to 90° C. to 95° C. to completely dissolve the resin.

Different weight ratios of diaminodiphenyl sulfone (abbreviated DDS, commercially available from ACROS, America) served as a curing agent, and boron trifluoride mono-ethylamine (abbreviated BF3-MEA, commercially available from ACROS, America) served as a catalyst were weighted as shown in Table 1, and added to the described epoxy resin solution. After the curing agent and the catalyst were totally dissolved, the polyester type dispersant (Uniqema) was added to the solution, and the solution was cooled to room temperature to become a resin binder. The resin binder was added different weight ratios of ceramic powders such as $BaTiO_3$, $SrTiO_3$, or NPO, and stirred with a high speed to form the varnish for forming the high-k dielectric layer DK1. Furthermore, the binder was added different weight ratios of high dielectric constant ceramic powders such as $BaTiO_3$, $SrTiO_3$, or NPO and conductive powders such as carbon black, aluminum zinc oxide, and aluminum, and stirred with a high speed to form the vanish for forming the high-k dielectric layer DK2.

The DK1 vanish was coated on a copper clad laminate, and charged in an oven (120° C. for 15 minutes) to remove solvent, such that the B-stage of the resin was efficiently controlled. Otherwise, the DK2 vanish was coated on a copper foil, and charged in an oven (120° C. for 15 minutes) to remove solvent, such that the B-stage of the resin was efficiently controlled. Subsequently, the DK1 coated copper foil was laminated with the DK2 coated copper foil at 200° C. for 2.5 hours. Thereafter, the bi-layered capacitor substrate structure of copper clad laminate (CCL) with high dielectric constant was completed. The described capacitor substrate was also completed by another method. The DK 1 vanish was coated on a copper foil, and charged in an oven (120° C. for 15 minutes) to remove solvent, such that the B-stage of the resin was efficiently controlled. Alternatively, the DK2 varnish was directly coated on the DK1 coating, and charged in an oven (120° C. for 15 minutes) to remove solvent, such that the B-stage of the resin was efficiently controlled. This bi-dielectric layer (DK1 and DK2) coated copper foil was then laminated with a blank copper foil at 200° C. for 2.5 hours. Thereafter, the bi-layered capacitor substrate structure with high dielectric constant was completed. It is understood that the described methods can be applied to form tri-layered (DK1, DK2, and DK3) dielectric structures in Example 1-4.

TABLE 1

| Composition | Example 1-1 | | Example 1-2 | | Example 1-3 | |
|---|---|---|---|---|---|---|
| | DK1 | DK2 | DK1 | DK2 | DK1 | DK2 |
| Bisphenol-A diglycidyl ether (g) | 9.15 | 9.10 | 9.10 | 9.05 | 9.02 | 9.10 |
| Tetrabromo bisphenol-A diglcidyl ether (g) | 5.50 | 5.50 | 5.50 | 5.60 | 5.56 | 5.50 |
| Cyclo aliphatic epoxy (g) | 2.25 | 2.30 | 2.30 | 2.35 | 2.32 | 2.30 |
| Multifunctional epoxy (g) | 1.90 | 1.80 | 1.85 | 1.80 | 1.78 | 1.85 |
| DDS (g) | 4.25 | 4.20 | 4.23 | 4.25 | 4.22 | 4.25 |
| BF3-MEA (g) | 0.07 | 0.07 | 0.07 | 0.07 | 0.07 | 0.07 |
| TPI (thermoplastics) | 0 | 0 | 0 | 0 | 0 | 0 |
| Dispersive agent (g) | 2.5 | 2.5 | 2.5 | 2.5 | 2.5 | 2.5 |
| $BaTiO_3$ (g) | 120 | 110 | 0 | 110 | 0 | 0 |
| $SrTiO_3$ (g) | 0 | 0 | 120 | 0 | 125 | 110 |
| Carbon black (g) | 0 | 1.58 | 0 | 1.60 | 0 | 0 |
| AZO (g) | 0 | 0 | 0 | 0 | 0 | 3.0 |
| Al (g) | 0 | 0 | 0 | 0 | 0 | 0 |

| Composition | Example 1-4 | | | Example 1-5 | | Example 1-6 | |
|---|---|---|---|---|---|---|---|
| | DK1 | DK2 | DK3 | DK1 | DK2 | DK1 | DK2 |
| Bisphenol-A diglycidyl ether (g) | 9.15 | 9.12 | 9.13 | 0 | 9.10 | 0 | 0 |
| Tetrabromo bisphenol-A diglcidyl ether (g) | 5.50 | 5.50 | 5.52 | 18.9 | 9.80 | 9.80 | 18.9 |
| Cyclo aliphatic epoxy (g) | 2.30 | 2.30 | 2.30 | 0 | 0 | 9.10 | 0 |
| Multifunctional epoxy (g) | 1.85 | 1.92 | 1.85 | 0 | 0 | 0 | 0 |
| DDS (g) | 4.24 | 4.25 | 4.25 | 4.25 | 4.26 | 4.25 | 4.23 |
| BF3-MEA (g) | 0.07 | 0.07 | 0.07 | 0.07 | 0.07 | 0.07 | 0.07 |
| TPI (thermoplastics) | 0 | 0 | 0 | 0 | 0 | 0 | 0 |
| Dispersive agent (g) | 2.5 | 2.5 | 2.5 | 2.5 | 2.5 | 2.5 | 2.5 |
| $BaTiO_3$ (g) | 146 | 110 | 146 | 140 | 110 | 140 | 110 |
| $SrTiO_3$ (g) | 0 | 0 | 0 | 0 | 0 | 0 | 0 |
| Carbon black (g) | 0 | 1.57 | 0 | 0 | 1.58 | 0 | 1.60 |
| AZO (g) | 0 | 0 | 0 | 0 | 0 | 0 | 0 |
| Al (g) | 0 | 0 | 0 | 0 | 0 | 0 | 0 |

TABLE 1-continued

|  | Example 1-7 | | Example 1-8 | | Example 1-9 | |
| --- | --- | --- | --- | --- | --- | --- |
| Composition | DK1 | DK2 | DK1 | DK2 | DK1 | DK2 |
| Bisphenol-A diglycidyl ether (g) | 9.15 | 9.13 | 0 | 9.11 | 9.15 | 9.14 |
| Tetrabromo bisphenol-A diglcidyl ether (g) | 5.50 | 5.52 | 0 | 5.52 | 5.52 | 5.50 |
| Cyclo aliphatic epoxy (g) | 2.30 | 2.30 | 0 | 2.31 | 2.31 | 2.31 |
| Multifunctional epoxy (g) | 1.85 | 1.90 | 0 | 1.90 | 1.86 | 1.89 |
| DDS (g) | 4.24 | 4.23 | 0 | 4.25 | 4.24 | 4.23 |
| BF3-MEA (g) | 0.07 | 0.07 | 0 | 0.07 | 0.07 | 0.07 |
| TPI (thermoplastics) | 0 | 0 | 20 | 0 | 0 | 0 |
| Dispersive agent (g) | 0 | 2.5 | 0 | 2.5 | 2.5 | 0.3 |
| $BaTiO_3$ (g) | 0 | 110 | 0 | 110 | 110 | 10 |
| $SrTiO_3$ (g) | 0 | 0 | 0 | 0 | 0 | 0 |
| Carbon black (g) | 0 | 1.57 | 0 | 1.58 | 0 | 0 |
| AZO (g) | 0 | 0 | 0 | 0 | 0 | 0 |
| Al (g) | 0 | 0 | 0 | 0 | 0 | 1.76 |

The physical properties and DK1/DK2/DK3 thickness of the bi-layered capacitor substrates in Examples 1-1 to 1-9 were measured and tabulated in Table 2. The peel strength was analyzed by the IPC-650 standard, the insulation current and the leakage current were measured under an operational voltage of 10V, and the soldering resistance (delamination or bubbling) was measured at 288° C./3 min.

Comparative Example 1

Similar to Example 1, the difference for Comparative Example 1 was that the insulation layer of the capacitor substrate was single-layered DK1 or DK2, and not bi-layered. In Comparative Example 1, the DK1 included organic resin and high dielectric constant ceramic powders, and the DK2

TABLE 2

| Properties | Example 1-1 | | | | | |
| --- | --- | --- | --- | --- | --- | --- |
| DK1 thickness (μm) | 15 | 8 | 3 | 6 | 9 | 10 |
| DK2 thickness (μm) | 15 | 15 | 1.5 | 4.5 | 15 | 10 |
| DK3 thickness (μm) | 0 | 0 | 0 | 0 | 0 | 0 |
| Dielectric constant (1 MHz) | 73.51 | 97.2 | 58.2 | 65.9 | 83.9 | 55 |
| Peel strength (lb/in) | 5.4 | 5.6 | 4.2 | 4.6 | 5.3 | 5.1 |
| Insulation resistance (Ω) | 1.9E+10 | 1.8E+05 | 2.9E+05 | 1.2E+06 | 1.2E+05 | 1.1E+09 |
| Leakage current (A) | 5.2E−10 | 5.5E−05 | 3.5E−05 | 8.3E−06 | 8.3E−05 | 9.1E−09 |
| soldering resistance | OK | OK | OK | OK | OK | OK |

| Properties | Example 1-4 | | | Example 1-5 | | | Example 1-6 |
| --- | --- | --- | --- | --- | --- | --- | --- |
| DK1 thickness (μm) | 7 | 9 | 7 | 7 | 7 | 5 | 9 |
| DK2 thickness (μm) | 30 | 30 | 18 | 10 | 7 | 15 | 12 |
| DK3 thickness (μm) | 7 | 9 | 7 | 0 | 0 | 0 | 0 |
| Dielectric constant (1 MHz) | 117 | 105 | 97.2 | 101.3 | 86.5 | 142.6 | 98.6 |
| Peel strength (lb/in) | 5.1 | 5.3 | 5.0 | 4.90 | 4.72 | 5.02 | 5.10 |
| Insulation resistance (Ω) | 1.2E+08 | 1.1E+08 | 1.8E+09 | 3.2E+05 | 8.3E+06 | 1.2E+05 | 1.9E+06 |
| Leakage current (A) | 8.1E−08 | 9.2E−08 | 5.6E−09 | 3.1E−05 | 1.2E−06 | 8.3E−05 | 5.3E−06 |
| soldering resistance | OK | OK | OK | OK | OK | OK | OK |

| Properties | Example 1-7 | Example 1-8 | Example 1-9 |
| --- | --- | --- | --- |
| DK1 thickness (μm) | 1 | 1.2 | 5 |
| DK2 thickness (μm) | 15 | 19 | 20 |
| DK3 thickness (μm) | 0 | 0 | 0 |
| Dielectric constant (1 MHz) | 55.3 | 52.6 | 55.1 |
| Peel strength (lb/in) | 4.96 | 4.28 | 4.73 |
| Insulation resistance (Ω) | 1.3E+07 | 3.0E+07 | 1.7E+08 |
| Leakage current (A) | 7.7E−07 | 3.3E−07 | 5.9E−08 |
| soldering resistance | OK | OK | OK | included organic resin, high dielectric constant ceramic powders and conductive powders. The processes such as mixing, coating, removing of solvent, and laminating in Comparative Example 1 were similar to that of Example 1. The compositions and corresponding weight ratio of Comparative Example 1 were tabulated in Table 3.

TABLE 3

| Composition | Comparative Example 1-1 | Comparative Example 1-2 |
| --- | --- | --- |
| Bisphenol-A diglycidyl ether (g) | 9.15 | 9.10 |
| Tetrabromo bisphenol-A diglcidyl ether (g) | 5.50 | 5.50 |
| Cyclo aliphatic epoxy (g) | 2.15 | 2.20 |
| Multifunctional epoxy (g) | 1.80 | 1.82 |
| DDS (g) | 4.20 | 4.23 |
| BF3-MEA (g) | 0.07 | 0.07 |
| Dispersive agent (g) | 2.5 | 2.6 |
| $BaTiO_3$ (g) | 110 | 110 |
| $SrTiO_3$ (g) | 0 | 0 |
| Carbon black (g) | 1.60 | 0.8 |

The thickness and physical properties of the single-layered capacitor substrate having high dielectric constant in Comparative Examples 1-1 and 1-2 were measured and tabulated in Table 4. The peel strength was analyzed by the IPC-650 standard, the insulation current and the leakage current were measured under an operational voltage of 10V, and the soldering resistance (delamination or bubbling) was measured at 288° C./3 min.

TABLE 4

| Properties | Comparative Example 1-1 | Comparative Example 1-2 |
| --- | --- | --- |
| Thickness (μm) | 20 | 20 |
| Dielectric constant (1 MHz) | 402.3 | 80.5 |
| Peel strength (1 b/in) | 5.3 | 5.5 |
| Insulation resistance (Ω) | <1.0E+2 | 2.9E+3 |
| Leakage current (A) | >1.0E−2 | 3.5E−3 |
| Soldering resistance | OK | OK |

As shown in Table 4, the dielectric constant of the capacitor substrates in Comparative Examples 1-1 and 1-2 reached 400 or 80, however, serious current leakage problems occurred and the Comparative Examples showed very low insulation resistance.

On the other hand, for the Examples utilizing the bi-layered high dielectric constant dielectric structures, in the capacitor substrate of Example 1-1, the DK1 and DK2 was stacked to form a bi-layered structure, or dual-coated to form a bi-layered structure. The dielectric constant was largely enhanced without increasing leakage current due to the bi-layered structure in Example 1-1, thereby simultaneously enhancing the insulation resistance of the capacitor substrate. The thickness of the dielectric layer influences properties such as dielectric constant, leakage current, and insulation resistance. In Example 1-2, the capacitor substrate applying the insulation layer (composed of the DK1 of 9 μm and the DK2 of 15 μm) had high dielectric constant of 83.9 and high insulation resistance of 1.2 E+0.05Ω

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A capacitor substrate structure, comprising:
   an insulation layer disposed between two conductive layers, comprising:
      a first dielectric layer and a second dielectric layer, wherein:
         the second dielectric layer has a greater dielectric constant than the first dielectric layer;
         the second dielectric layer comprises ceramic powders and conductive powders dispersed in an organic resin; and
         the ceramic powders comprise $BaTiO_3$, $BaSrTiO_3$, $SrTiO_3$, NPO, or combinations thereof.

2. The capacitor substrate structure as claimed in claim 1, wherein the organic resin comprises thermoplastic resin or thermosetting resin.

3. The capacitor substrate structure as claimed in claim 1, wherein the ceramic powders have a particle size having a diameter of 20 nm to 2 μm, and a weight ratio of 5% to 95% in the second dielectric layer.

4. The capacitor substrate structure as claimed in claim 1, wherein the ceramic powders are further doped by a metal ion comprising calcium ion, magnesium ion, zirconium ion, or bismuth ion.

5. The capacitor substrate structure as claimed in claim 1, wherein the conductive powders have a particle size having a diameter of 10 nm to 2 μm, and the conductive powders and the second dielectric layer have a weight ratio of 0.01:100 to 20:100.

6. The capacitor substrate structure as claimed in claim 1, wherein the conductive powders comprise conductive carbon black, metal, metal oxide, or combinations thereof.

7. The capacitor substrate structure as claimed in claim 6, wherein the conductive carbon black comprises high structure carbon black, low structure carbon black, carboxyl or hydroxyl surface modified carbon black, or combinations thereof.

8. The capacitor substrate structure as claimed in claim 6, wherein the metal comprises Ni, Al, Ag, Cu, alloys thereof, or combinations thereof.

9. The capacitor substrate structure as claimed in claim 6, wherein the metal oxide comprises $Al_2O_3$, ZnO, Zn(Al)O, $SnO_2$, $In_2O_3$, or combinations thereof.

10. The capacitor substrate structure as claimed in claim 1, wherein the first dielectric layer comprises an organic resin.

11. The capacitor substrate structure as claimed in claim 1, wherein the first dielectric layer comprises ceramic powders dispersed in an organic resin.

12. The capacitor substrate structure as claimed in claim 1, wherein the insulation layer further comprises a third dielectric layer composed of an organic resin, the second dielectric layer is disposed between the first dielectric layer and the third dielectric layer, and the second dielectric layer has a greater dielectric constant than the third dielectric layer.

13. The capacitor substrate structure as claimed in claim 1, wherein the insulation layer further comprises a third dielectric layer comprising ceramic powders dispersed in an organic resin, the second dielectric layer is disposed between the first dielectric layer and the third dielectric layer, and the second dielectric layer has a greater dielectric constant than the third dielectric layer.

14. The capacitor substrate structure as claimed in claim 1, further comprising a via partially or fully connecting the capacitor substrate structure of claim 1 with another capacitor substrate structure or other circuits of the substrate, wherein the via comprises:
 an inner ring composed of a conductive material; and
 an outer ring composed of a dielectric material, wherein the dielectric material comprises an organic resin or ceramic powders dispersed in an organic resin.

15. The capacitor substrate structure as claimed in claim 14, wherein the via further comprises an air gap in the inner ring.

* * * * *